United States Patent
Cheng et al.

(10) Patent No.: US 10,978,511 B1
(45) Date of Patent: Apr. 13, 2021

(54) SEMICONDUCTOR DEVICE AND MEMORY CELL

(71) Applicant: MACRONIX INTERNATIONAL CO., LTD., Hsinchu (TW)

(72) Inventors: Huai-Yu Cheng, Hsinchu (TW); I-Ting Kuo, Taoyuan (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/601,647

(22) Filed: Oct. 15, 2019

(51) Int. Cl.
*H01L 27/24* (2006.01)
*H01L 45/00* (2006.01)

(52) U.S. Cl.
CPC ...... *H01L 27/2409* (2013.01); *H01L 27/2481* (2013.01); *H01L 45/06* (2013.01); *H01L 45/1233* (2013.01)

(58) Field of Classification Search
CPC . H01L 27/2409; H01L 45/06; H01L 45/1233; H01L 45/143
See application file for complete search history.

(56) References Cited

U.S. PATENT DOCUMENTS

| | | | |
|---|---|---|---|
| 10,256,406 B2 * | 4/2019 | Collins | H01L 45/1233 |
| 10,374,009 B1 | 8/2019 | Cheng et al. | |
| 2011/0095257 A1 | 4/2011 | Xu et al. | |
| 2019/0043924 A1 * | 2/2019 | Conti | H01L 27/2463 |
| 2019/0081103 A1 | 3/2019 | Fantini et al. | |

* cited by examiner

*Primary Examiner* — Allison Bernstein
(74) *Attorney, Agent, or Firm* — McClure, Qualey & Rodack, LLP (57) ABSTRACT

A semiconductor device includes a first electrode, a second electrode, and an In-doped chalcogenide-based selector layer disposed between the first electrode and the second electrode, in which the In-doped chalcogenide-based selector layer has an In compound content of about 2 at. % to about 10 at. %. A memory cell including the In-doped chalcogenide-based selector layer is also provided.

16 Claims, 9 Drawing Sheets

SEMICONDUCTOR DEVICE AND MEMORY CELL

BACKGROUND

Field of Invention

The present disclosure relates to a memory access device.

Description of Related Art

Scaling dimensions of phase change random access memory (PCRAM) and resistive random access memory (RRAM) to achieve dense cross-point memory requires development of a selector device with a small footprint. Typically, transistors have a larger footprint and limit the memory density achievable. Two-terminal access devices are more suitable selectors for scaled memory technology.

Large cross-point memory array typically require large amount of the selectors. Threshold voltage of selectors can be tuned by tuning the thickness of the selector layer. However, a decrease in thickness of the selector layer can cause an increase of device leakage current (IOFF) which, in turn, can increase power consumption of the memory array.

SUMMARY

According to some embodiments of the disclosure, a semiconductor device includes a first electrode, a second electrode, and an In-doped chalcogenide-based selector layer disposed between the first electrode and the second electrode, in which the In-doped chalcogenide-based selector layer has an In compound content of about 2 at. % to about 10 at. %.

According to some embodiments of the disclosure, a memory cell, includes an access device and a phase change material disposed on the access device. The access device includes a first electrode, a second electrode, and an In-doped chalcogenide-based selector layer disposed between the first electrode and the second electrode, in which the In-doped chalcogenide-based selector layer has an In compound content of about 2 at. % to about 10 at. %.

The In-doped chalcogenide-based selector layer can improve the material stability, adhesion, and variability during the fabrication. Therefore, the semiconductor device using the In-doped chalcogenide-based selector layer may have improved yield and show less cycling degradation.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 1:
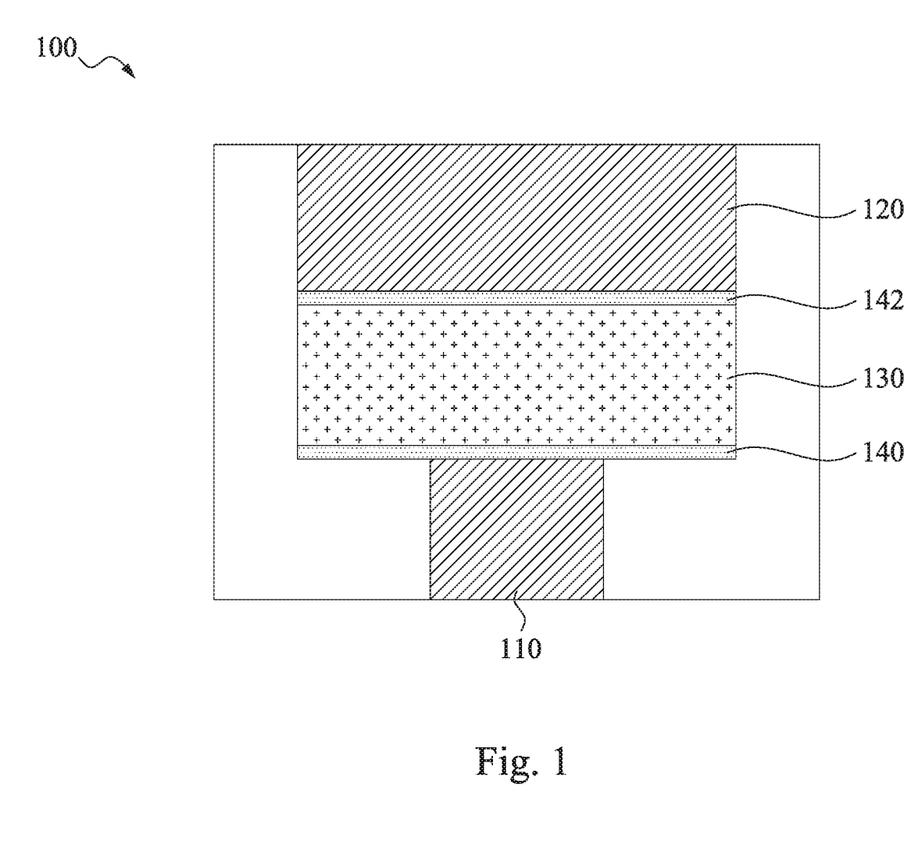
FIG. 1 is a cross-sectional view of an example selector, according to some embodiments of the disclosure.

FIG. 1 is a cross-sectional view of an example selector, according to some embodiments of the disclosure. The selector 100 includes a first electrode 110 and a second electrode 120 over the first electrode 110. In some embodiments, the material of the first electrode 110 can be the same or different from that of the second electrode 120. Examples of materials for the first electrode 110 include tungsten (W) or titanium nitride (TiN). Examples of materials for the second electrode 120 include W or titanium nitride (TiN).

The selector 100 includes an In-doped chalcogenide-based selector layer 130 sandwiched between the first electrode 110 and the second electrode 120. Example chalcogenide materials of the In-doped chalcogenide-based selector layer 130 include Arsenic (As), Germanium (Ge), Selenium (Se), and Indium (In), e.g. the In-doped chalcogenide-based selector layer 130 is an In-doped AsSeGe layer. In some embodiments, the In-doped chalcogenide-based selector layer 130 has an In compound content of about 2 at. % to about 10 at. %. If In doping amount of the In-doped chalcogenide-based selector layer 130 is too high, the leakage current (IOFF) becomes bad, and the threshold voltage (Vth) decreases accordingly.

In some embodiments, the In-doped chalcogenide-based selector layer 130 has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %.

In some embodiments, the selector 100 further includes two etching stop layers 140, 142 disposed between the first electrode 110 and the In-doped chalcogenide-based selector layer 130 and between the In-doped chalcogenide-based selector layer 130 and the second electrode 120, respectively. In some embodiments, the etching stop layers 140, 142 can be carbon layers or silicon doped with carbon (Si:C) layers.

The In-doped chalcogenide-based selector layer 130 can improve the material stability, adhesion, and variability during the fabrication. Therefore, the selectors 100 using the In-doped chalcogenide-based selector layer 130 may have improved yield and show less cycling degradation. As discussed above, the In-doped chalcogenide-based selector layer 130 has the In compound content of about 2 at. % to about 10 at. %. If In doping amount of the In-doped chalcogenide-based selector layer 130 is too low, the improvement is not obvious. In some embodiments, the thickness of the In-doped chalcogenide-based selector layer 130 is about 15 nm to about 45 nm. The selector 100 that having the In-doped chalcogenide-based selector layer 130 having such thickness is still able to provide high threshold voltage and low IOFF of selectors 100 for a high density 3D cross-point array technology.

For example, in an example selector 100 that having the In-doped chalcogenide-based selector layer 130 with a thickness of about 30 nm, the threshold voltage of the selector 100 is about 3.7V, the IOFF is about 700 pA at 2V. This example selector 100 can be turned on at 10 ns, which is a very fast response speed.

Reference is now made to FIGS. 2A-2E, in which FIGS. 2A-2E are schematic views of different stages of a manufacturing process for manufacturing the selector 100 of FIG. 1, according to some embodiments of the disclosure.

Figure 2A:
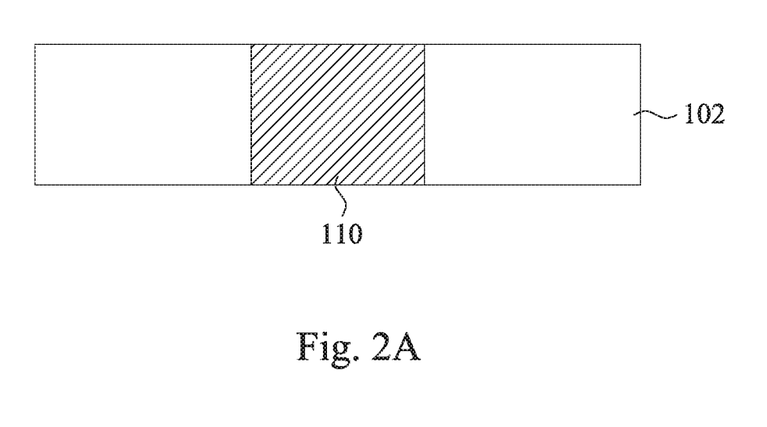
FIGS. 2A-2E are schematic views of different stages of a manufacturing process for manufacturing the selector of FIG. 1, according to some embodiments of the disclosure.

As shown in FIG. 2A, the first electrode 110 is formed extending through dielectric layer 102. The first electrode 110 extends through the dielectric layer 102 and is connected to the underlying access circuitry (not shown). The configuration of elements of the access circuitry depends upon the array configuration. Generally, example of the access circuitry may include such as transistors and diodes, word lines and sources lines, conductive plugs, and doped regions within a semiconductor substrate, etc.

In some embodiments, the dielectric layer 102 can be formed on the top surface of access circuitry. Then a photoresist layer is then deposited and patterned on the dielectric layer 102 by using photolithographic techniques so as to form a patterned photoresist layer overlying the location of the first electrode 110. Then the dielectric layer 102 is etched using the patterned photoresist layer as the mask, thereby forming a via in the dielectric layer 102. After the patterned photoresist layer is removed, a conductive material, such as W or TiN, is then filled in the via. A planarizing process is then performed to remove the portion of the conductive material exceeding the dielectric layer 102, thereby obtaining the first electrode 110 embedded in the dielectric layer 102.

Figure 2B:
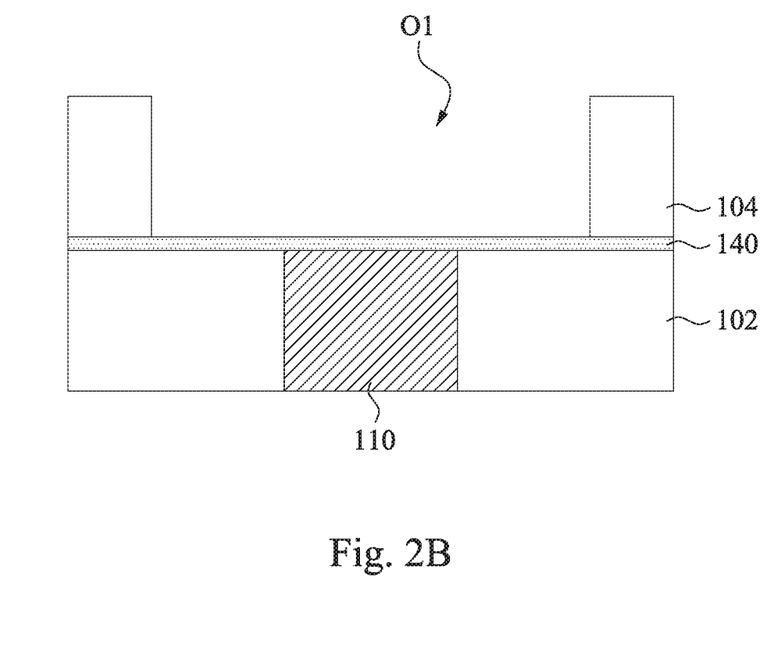

Reference is made to FIG. 2B, an etching stop layer 140 and additional dielectric layer 104 is formed over the dielectric layer 102. In some embodiments, the etching stop layer 140 includes a material that has different composition of that of the dielectric layer 104. For example, the etching stop layer 140 includes carbon, silicon doped with carbon (Si:C), or the likes, and the dielectric layers 102 and 104 includes oxide, such as silicon oxide or the likes. The etching stop layer 140 can be formed by any suitable deposition process.

The dielectric layer 104 is patterned to form an opening O1 over the first electrode 110. The step of patterning the dielectric layer 104 includes forming a patterned photoresist layer on the layer of dielectric layer 104, and then etching dielectric layer 104 by using the patterned photoresist layer as the mask, and the etching process is stop at reaching the etching stop layer 140. In some embodiments, the portion of the etching stop layer 140 uncovered by the patterned photoresist layer may be entirely consumed to expose the underlying first electrode 110. In some other embodiments, the portion of the etching stop layer 140 uncovered by the patterned photoresist layer may remain on the dielectric layer 102. The patterned photoresist layer is then removed.

Figure 2C:
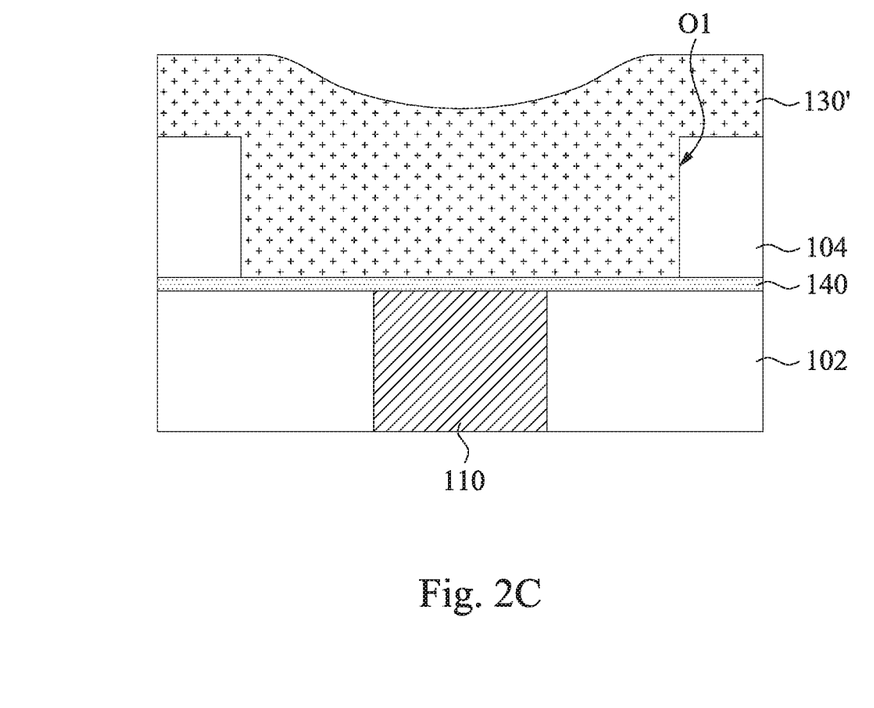
Figure 2D:
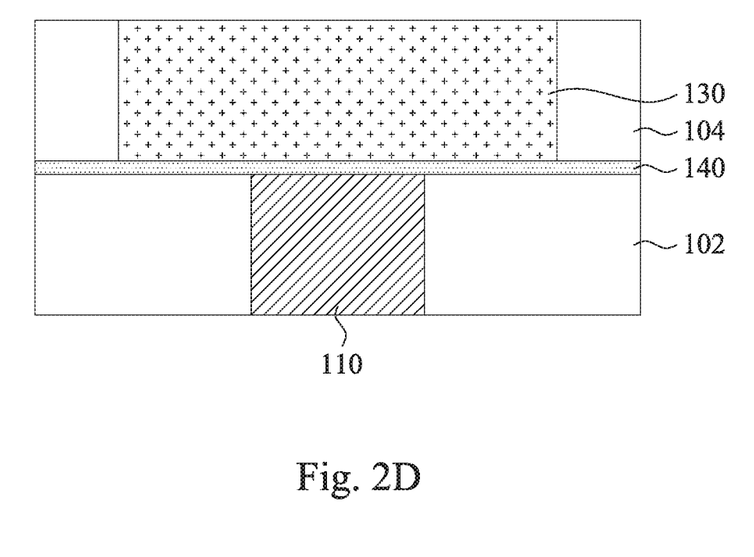

Reference is made to FIGS. 2C and 2D, a layer of In-doped chalcogenide-based material 130' is deposited and filled in the opening O1. In some embodiments, the layer of In-doped chalcogenide-based material 130' is formed by a sputter process, such as a radio frequency (RF) sputter process. A target is disposed adjacent to the substrate, such as over the first electrode 110, the dielectric layer 104, and the etching stop layer 140. The target contains material that is deposited on the substrate during the sputter process.

During the sputter process, the target is biased relative to a grounded region of the processing chamber by a power source disposed in the RF source and the direct current (DC) source. During the sputter processing, a gas is supplied to the processing chamber from a gas source via conduits. The gas source may include a non-reactive gas such as argon, krypton, helium or xenon, which is capable of energetically impinging upon and sputtering material from the target. A plasma is formed between the substrate and the target from the gas. Ions within the plasma are accelerated toward the target and cause material to become dislodged from the target. The dislodged target material is deposited on the substrate, thereby forming the layer of In-doped chalcogenide-based material 130'.

In some embodiments, the composition of the target is identical or similar to that of the layer of In-doped chalcogenide-based material 130'. In some embodiments, the materials of the target include Arsenic (As), Germanium (Ge), Selenium (Se), and Indium (In). In some embodiments, the target has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %.

After the layer of In-doped chalcogenide-based material 130' is deposited and filling the opening O1, a planarizing process is then performed to remove the portion of the In-doped chalcogenide-based material 130' exceeding the dielectric layer 104, thereby obtaining the In-doped chalcogenide-based selector layer 130 embedded in the dielectric layer 104. In some embodiments, the thickness of the In-doped chalcogenide-based selector layer 130 is about 15 nm to about 45 nm.

Figure 2E:
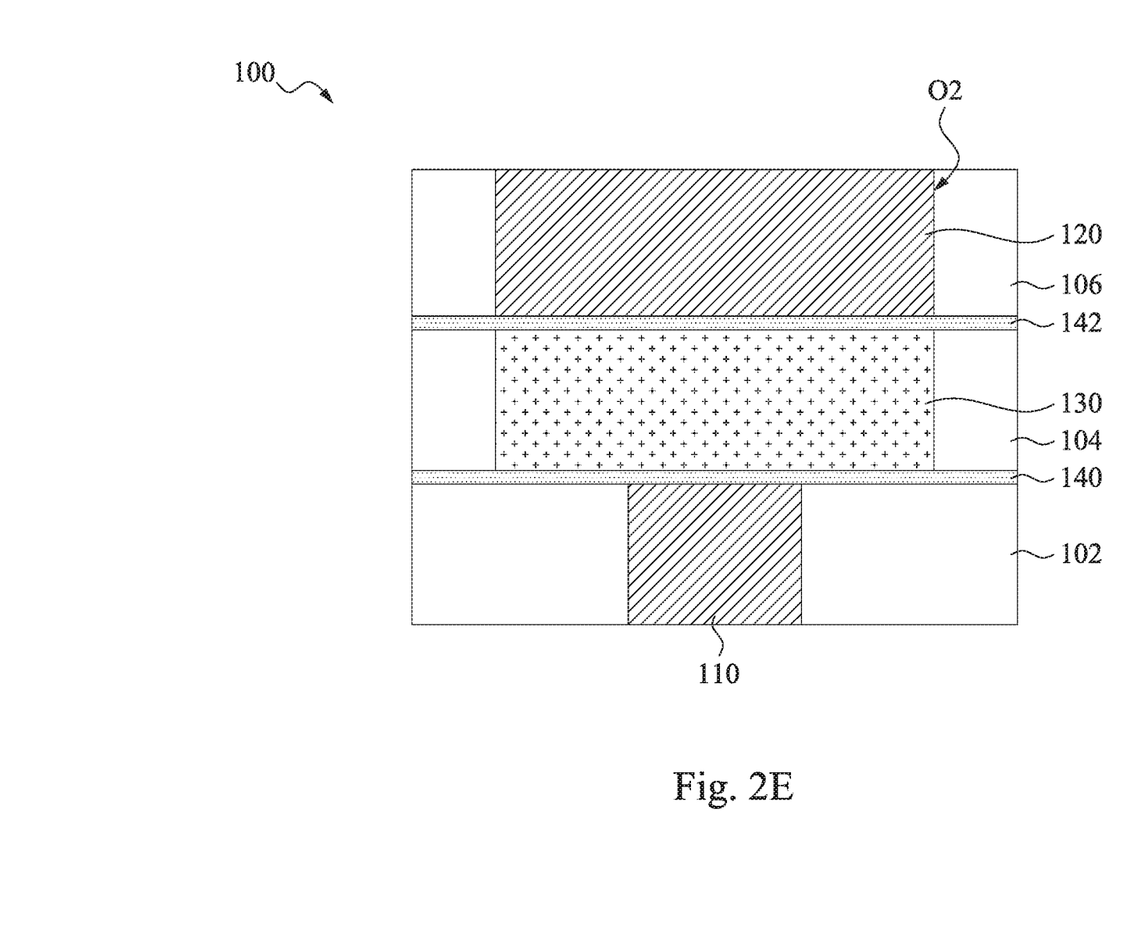

Reference is made to FIG. 2E, the second electrode 120 is formed on the In-doped chalcogenide-based selector layer 130. In some embodiments, the etching stop layer 142 is formed on the In-doped chalcogenide-based selector layer 130 and the dielectric layer 104, and an additional dielectric layer 106 is formed on the etching stop layer 142 and is patterned to form an opening O2 over the In-doped chalcogenide-based selector layer 130. The step of patterning the dielectric layer 106 includes forming a patterned photoresist layer on the dielectric layer 106, and then etching dielectric layer 106 by using the patterned photoresist layer as the mask, and the etching process is stop at reaching the etching stop layer 142. The portion of the etching stop layer 142 uncovered by the patterned mask may be entirely consumed or partially remained on the dielectric layer 104. The patterned photoresist layer is then removed.

After the patterned photoresist layer is removed, a conductive material, such as W or TiN, is then filled in the opening O2. A planarizing process is then performed to remove the portion of the conductive material exceeding the dielectric layer 106, thereby obtaining the second electrode 120 embedded in the dielectric layer 106 and on the In-doped chalcogenide-based selector layer 130.

In some embodiments, the width of the In-doped chalcogenide-based selector layer 130 and the width of the second electrode 120 are substantially the same, and the width of the first electrode 110 is smaller than the width of the In-doped chalcogenide-based selector layer 130 and the second electrode 120 thereon. In some other embodiments, the widths of the first electrode 110, the In-doped chalcogenide-based selector layer 130, and the second electrode 120 are substantially the same.

Figure 3:
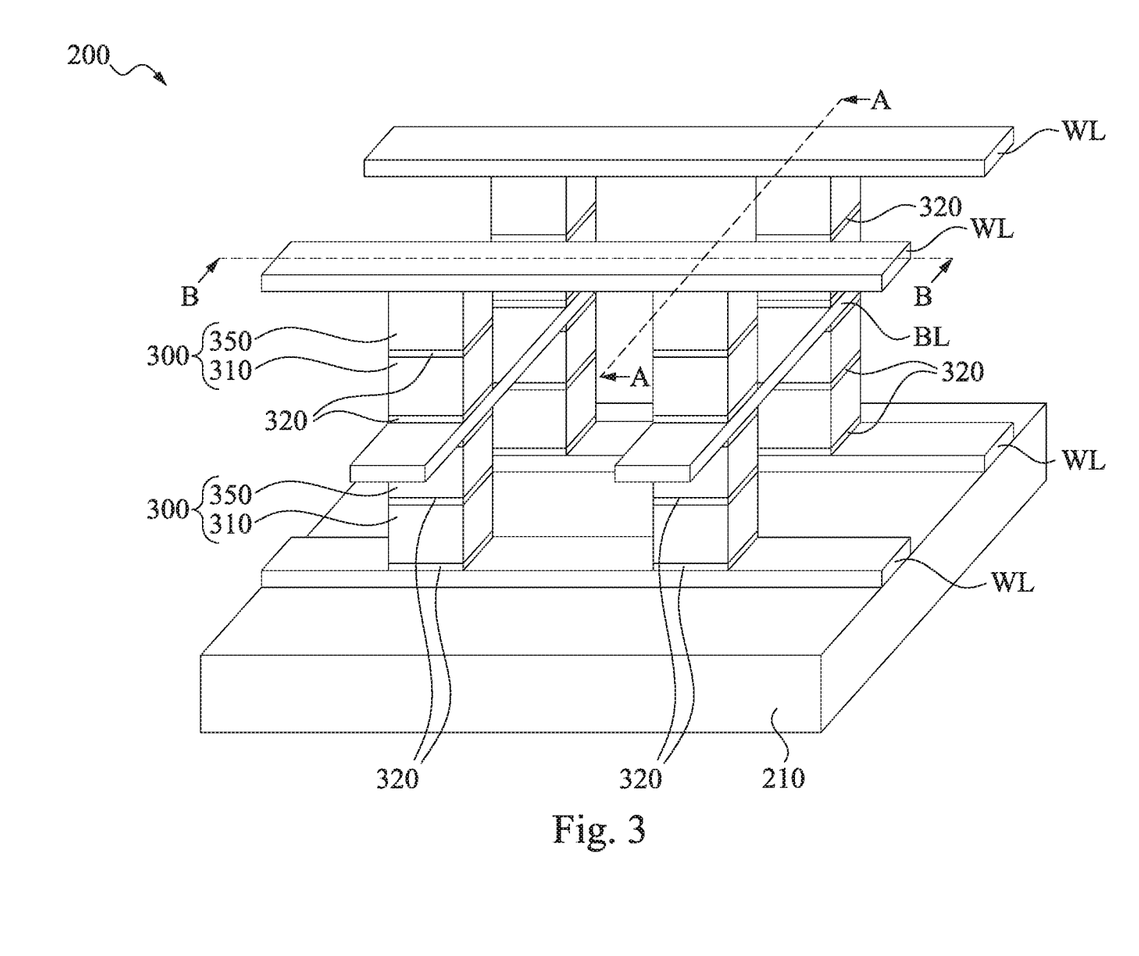
FIG. 3 is a schematic 3D stack view of a device according to some embodiments of the disclosure.

Reference is made to FIG. 3, which is a schematic 3D stack view of a device 200, according to some embodiments of the disclosure. The device 200 includes an array of memory cells 300 over a substrate 210. The substrate 210 includes a semiconductor substrate, or a semiconductor substrate having circuits thereon. In some embodiments, the substrate 210 is a back end of line (BEOL) substrate or a front end of line (FEOL) substrate.

Each memory cell 300 in the array includes an access device 310 and a memory 350, and the access device 310 and the memory 350 are in form of a semiconductor pillar. Bit lines BLs, which are conductive lines, are connected to first groups of memory cells 300, and word lines WLs, which are conductive lines, running perpendicular to the bit lines BLs, are connected to second groups of memory cells 300. The access device 310 includes the In-doped chalcogenide-based selector layer. In some embodiments, the In-doped chalcogenide-based selector layer has an In compound content of about 2 at. % to about 10 at. %. If In doping amount of the In-doped chalcogenide-based selector layer is too high, the leakage current becomes bad, and the threshold voltage decreases accordingly. In some embodiments, the In-doped chalcogenide-based selector layer has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %.

In some embodiments, the memory cells 300 may be vertically stacked in a three-dimensional memory array. A dielectric layer is formed surrounding the memory cells 300. In some embodiments, one memory cell 300 may be vertically stacked above another memory cell 300 and are spaced apart from each other by the dielectric layer. In some embodiments, etching stop layers 320 are interposed between the access device 310, the memory 350, and the conductive lines, e.g. the word lines WL and the bit lines BL. The etching stop layers 320 can be layers that include carbon or silicon doped with carbon (Si:C).

Figure 4A:
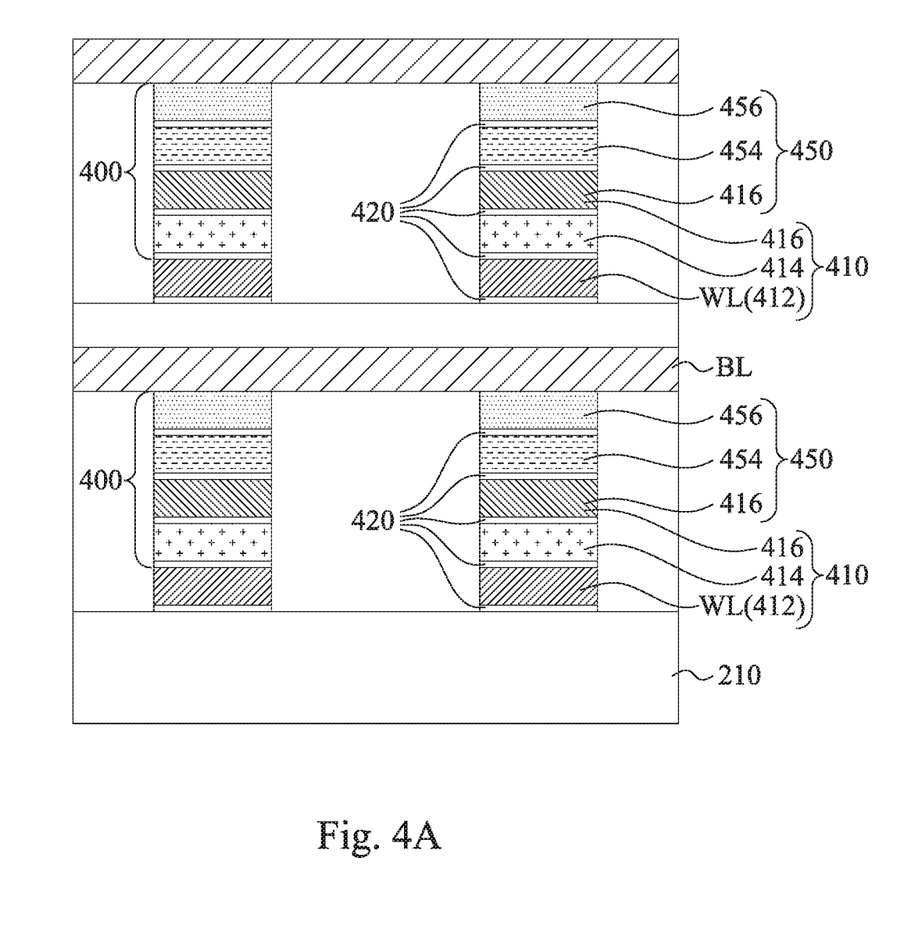
FIG. 4A is a cross-sectional view shows one stack of the first groups of the memory cells along a plane, according to some other embodiments.
Figure 4B:
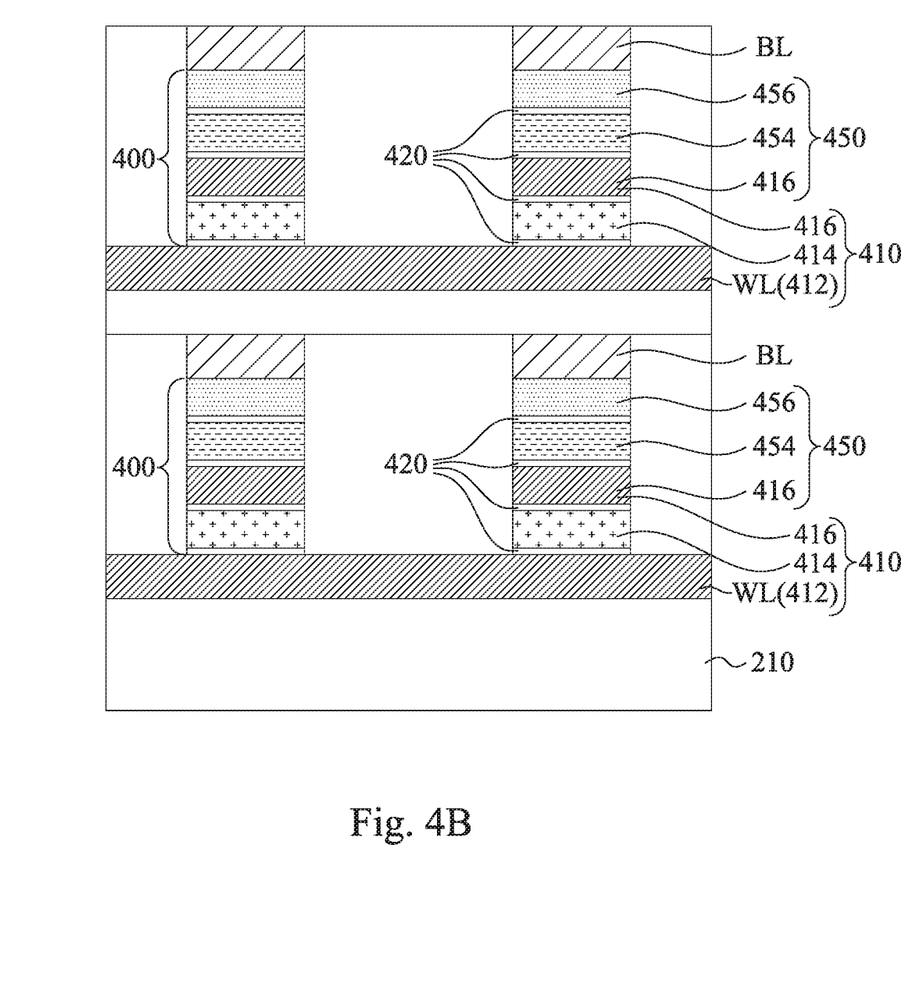
FIG. 4B is a cross-sectional view shows one stack of the second groups of the memory cells along another plane, according to some other embodiments.

Reference is made to FIG. 4A and FIG. 4B. FIG. 4A and FIG. 4B respectively are cross-sectional views that show one stack of the first groups of the memory cells 400 along different planes, according to some other embodiments. For example, FIG. 4A is taken along line A-A of FIG. 3. FIG. 4B is taken along line B-B of FIG. 3.

Each of the word line WL extends along a first direction and connects the second group of memory cells 400 in parallel. The word line WL also serves as a first electrode 412 of each of the access device 410. An In-doped chalcogenide-based selector layer 414 is formed on the first electrode 412 of each of the access device 410. The In-doped chalcogenide-based selector layer 414 includes chalcogenide materials, such as Arsenic (As), Germanium (Ge), Selenium (Se), and Indium (In). In some embodiments, In-doped chalcogenide-based selector layer 414 is In-doped AsSeGe layer. In some embodiments, the In-doped chalcogenide-based selector layer 414 has an In compound content of about 2 at. % to about 10 at. %. If In doping amount of the In-doped chalcogenide-based selector layer 414 is too high, the IOFF becomes bad, and the threshold voltage decreases accordingly.

In some embodiments, the In-doped chalcogenide-based selector layer 414 has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %. In some embodiments, the thickness of the In-doped chalcogenide-based selector layer 414 is about 15 nm to about 45 nm.

A second electrode 416 is formed on the In-doped chalcogenide-based selector layer 414. The first electrode 412 and the second electrode 416 include conductive material such as W or TiN. In some embodiments, the In-doped chalcogenide-based selector layer 414 is physically and electrically in contact with the first electrode 412 and the second electrode 416. In some other embodiments, additional layers, such as etching stop layers, thermal layers, work function layers, or other suitable layers can be interposed between the first electrode 412, the In-doped chalcogenide-based selector layer 414, and the second electrode 416. The steps of manufacturing of the access device 410 are similar to that as discussed in FIG. 2A to FIG. 2E.

The second electrode 416 also serves as a bottom electrode of the memory 450. The memory 450 is electrically coupled to the access device 410 and is programmable to at least two resistive states. In some embodiments, the memory 450 includes a phase change material (PCM) 454 on the bottom electrode 452. The phase change material 454 is electrically connected to the second electrode 416. The phase change material 454 may be a material programmable to either a first phase having a first electrical resistance or a second phase having a second electrical resistance, where the first electrical resistance is greater than the second electrical resistance.

In some embodiments, the phase change material 454 may include a Germanium-Antimony-Tellurium (GST) compound, such as $Ge_2Sb_2Te_5$. Other phase change materials, such as SbTe or $In_2Se_3$, may also be used. In some embodiments, the array of memory cells 400 is a multi-bit memory array. Thus, the phase change material 454 is programmed to one of at least three resistance levels.

Each bit line BL extends along a second direction and connects the first group of memory cells 400 in parallel. The top electrode 456 of the memory 450 is disposed on the phase change material 454 and is connected to the bit line BL.

In some embodiments, etching stop layers 420 are interposed between the conductive layers and semiconductive layers, such as between the world line WL (the first electrode 412), the In-doped chalcogenide-based selector layer 414, the second electrode 416, the phase change material 454, and the top electrode 456. The etching stop layers 420 can be layers that include carbon or silicon doped with carbon (Si:C).

Thus, the array of memory cells 400 is disclosed, in which each of the memory cells 400 includes a one-selector one-resistor (1S1R) semiconductor structure. The memory cells 400 of one-selector one-resistor structure allow high density and monolithic 3D integration. Additionally, by introducing the In-doped chalcogenide-based selector layer 414 into the access device 410, the memory cells 400 may have high threshold voltage, low IOFF, and high endurance performance for high density 3D cross point technology. For example, the threshold voltage of the memory cell 400 can be greater than 3V for a device using In-doped chalcogenide-based selector layer 414 with 30 nm thickness, IOFF can be less than 1 nA at 2V, the endurance can be greater than 1E10 cycles. The In-doped chalcogenide-based selector layer 414 can improve the material stability, adhesion, and variability during the fabrication, thus cell to cell variation becomes small, yield is improved, and cycle to cycle degradation becomes less.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a first electrode;
a second electrode; and
an In-doped chalcogenide-based selector layer disposed between the first electrode and the second electrode, wherein the In-doped chalcogenide-based selector layer is an In-doped AsSeGe layer and has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %.

2. The semiconductor device of claim 1, wherein a thickness of the In-doped chalcogenide-based selector layer is about 15 nm to about 45 nm.

3. The semiconductor device of claim 1, wherein the first electrode comprises titanium nitride or tungsten.

4. The semiconductor device of claim 1, wherein the second electrode comprises titanium nitride or tungsten.

5. The semiconductor device of claim 1, further comprising an etching stop layer between the first electrode and the In-doped chalcogenide-based selector layer.

6. The semiconductor device of claim 5, wherein the etching stop layer comprises carbon or silicon doped with carbon (Si:C).

7. The semiconductor device of claim 1, further comprising an etching stop layer between the second electrode and the In-doped chalcogenide-based selector layer.

8. The semiconductor device of claim 7, wherein the etching stop layer comprises carbon or silicon doped with carbon (Si:C).

9. A memory cell, comprising:
an access device, comprising a first electrode, a second electrode, and an In-doped chalcogenide-based selector layer disposed between the first electrode and the second electrode, wherein the In-doped chalcogenide-based selector layer is an In-doped AsSeGe layer and has an In compound content of about 2 at. % to about 10 at. %, an As compound content of about 25 at. % to about 38 at. %, a Ge compound content of about 8 at. % to about 20 at. %, and a Se compound content of about 30 at. % to about 60 at. %; and
a phase change material disposed on the access device.

10. The memory cell of claim 9, wherein a thickness of the In-doped chalcogenide-based selector layer is about 15 nm to about 45 nm.

11. The memory cell of claim 9, wherein the first electrode is a first conductive line extending along a first direction.

12. The memory cell of claim 11, further comprising a second conductive line disposed above the phase change material.

13. The memory cell of claim 12, wherein the second conductive line extends along a second direction, in which the first direction is perpendicular to the second direction.

14. The memory cell of claim 12, further comprising a third electrode connecting the second conductive line and the phase change material.

15. The memory cell of claim 9, wherein the phase change material is electrically connected to the second electrode.

16. The memory cell of claim 9, further comprising an additional access device stacked above the access device.

* * * * *